(12) United States Patent
Tzeng et al.

(10) Patent No.: US 6,207,492 B1
(45) Date of Patent: Mar. 27, 2001

(54) COMMON GATE AND SALICIDE WORD LINE PROCESS FOR LOW COST EMBEDDED DRAM DEVICES

(75) Inventors: Kuo-Chyuan Tzeng; Tse-Liang Ying; Chen-Jong Wang; Kevin Chiang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/587,466

(22) Filed: Jun. 5, 2000

(51) Int. Cl.[7] .................................. H01L 21/8242
(52) U.S. Cl. ............................ 438/241; 438/655
(58) Field of Search ..................... 438/241, 253, 438/296, 396, 655, 656

(56) References Cited

U.S. PATENT DOCUMENTS

| | | | |
|---|---|---|---|
| 5,858,831 | 1/1999 | Sung | 438/241 |
| 5,897,348 | 4/1999 | Wu | 438/200 |
| 5,950,090 | 9/1999 | Chen et al. | 438/296 |
| 5,998,247 | 12/1999 | Wu | 438/200 |
| 5,998,251 | 12/1999 | Wu et al. | 438/241 |
| 6,153,459 | * 11/2000 | Sun | 438/241 |

* cited by examiner

*Primary Examiner*—Chandra Chaudhari
(74) *Attorney, Agent, or Firm*—George O. Saile; Stephen B. Ackerman

(57) ABSTRACT

A process for forming logic devices with salicide shapes on gate structures, as well as on heavily doped source/drain regions, while simultaneously forming embedded DRAM devices with salicide shapes only on gate structures, has been developed. The process features silicon oxide blocking shapes, formed in the spaces between gate structures, in the embedded DRAM device region. The silicon oxide blocking shapes are formed using a high density plasma deposition procedure which deposits a thick silicon oxide layer in the narrow spaces between gate structures in the embedded DRAM device region, and a thin silicon oxide layer in the wider spaces between gate structures in the logic device region, and on the top surface of all gate structures. A blanket, dry etch procedure is then employed to remove the thin silicon oxide layers from the top surface of all gate structures, as well as from the spaces between gate structures in the logic device region, while forming the desired silicon oxide blocking shapes between gate structures in the embedded DRAM device region, therefore allowing subsequent salicide shapes to be formed only on the top surface of gate structures, and on heavily doped source/drain regions in the logic device region.

23 Claims, 5 Drawing Sheets

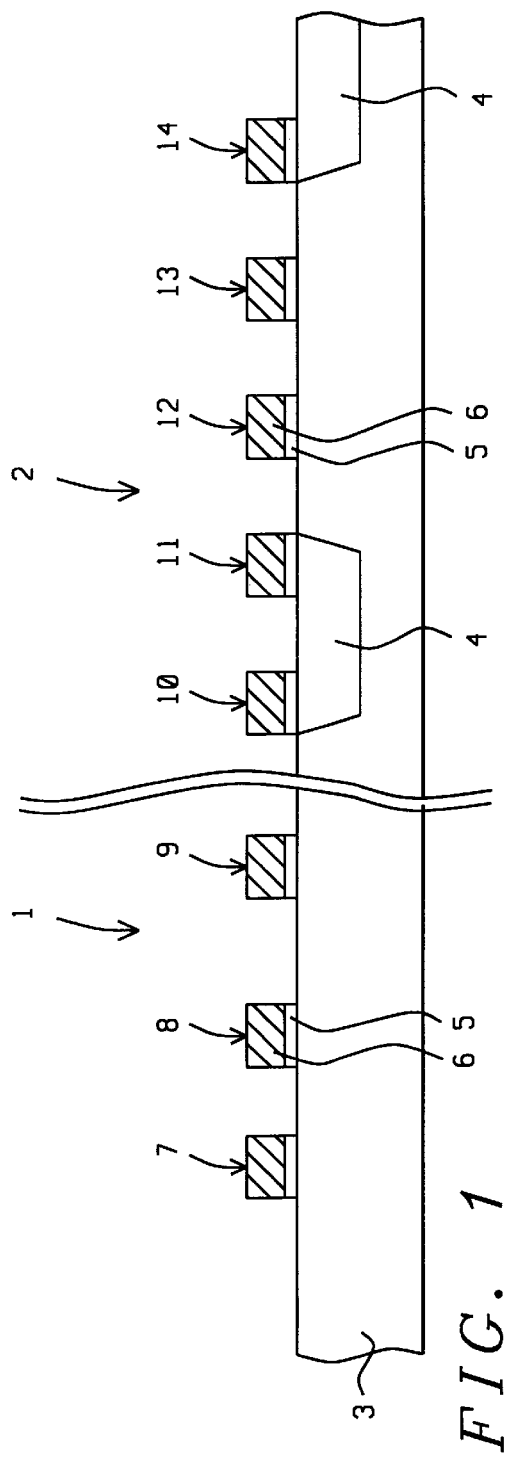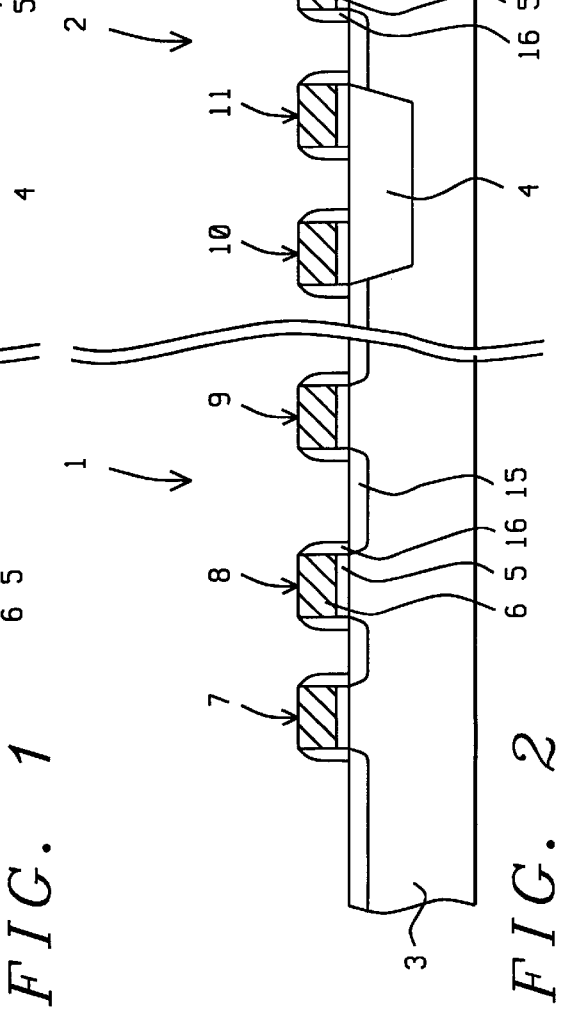

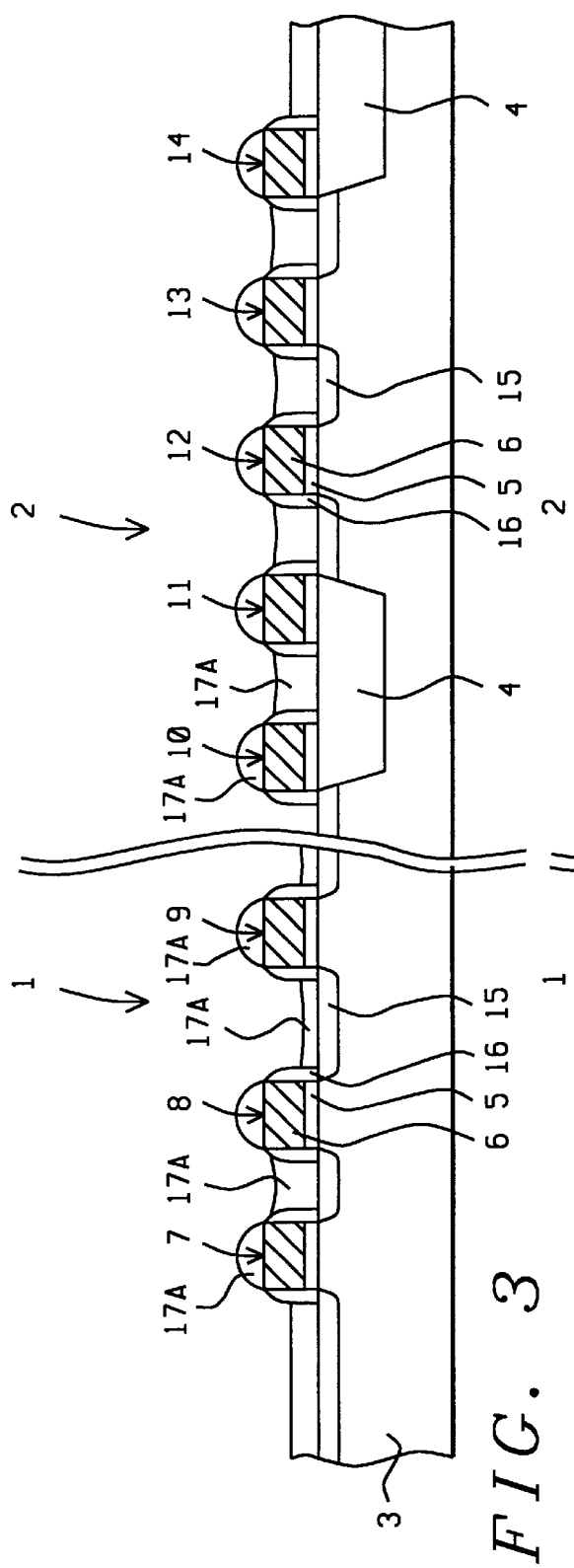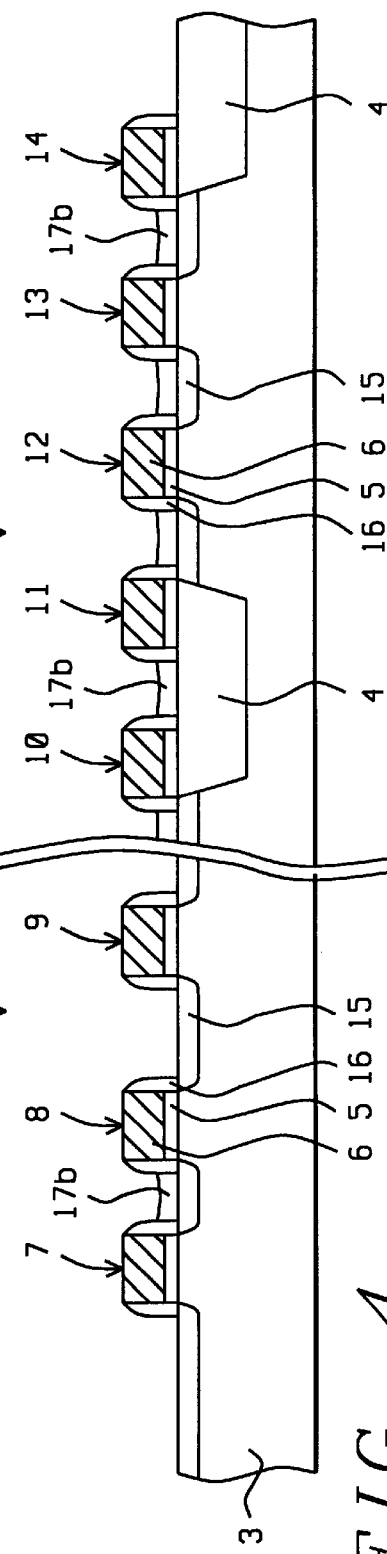
FIG. 3
FIG. 4

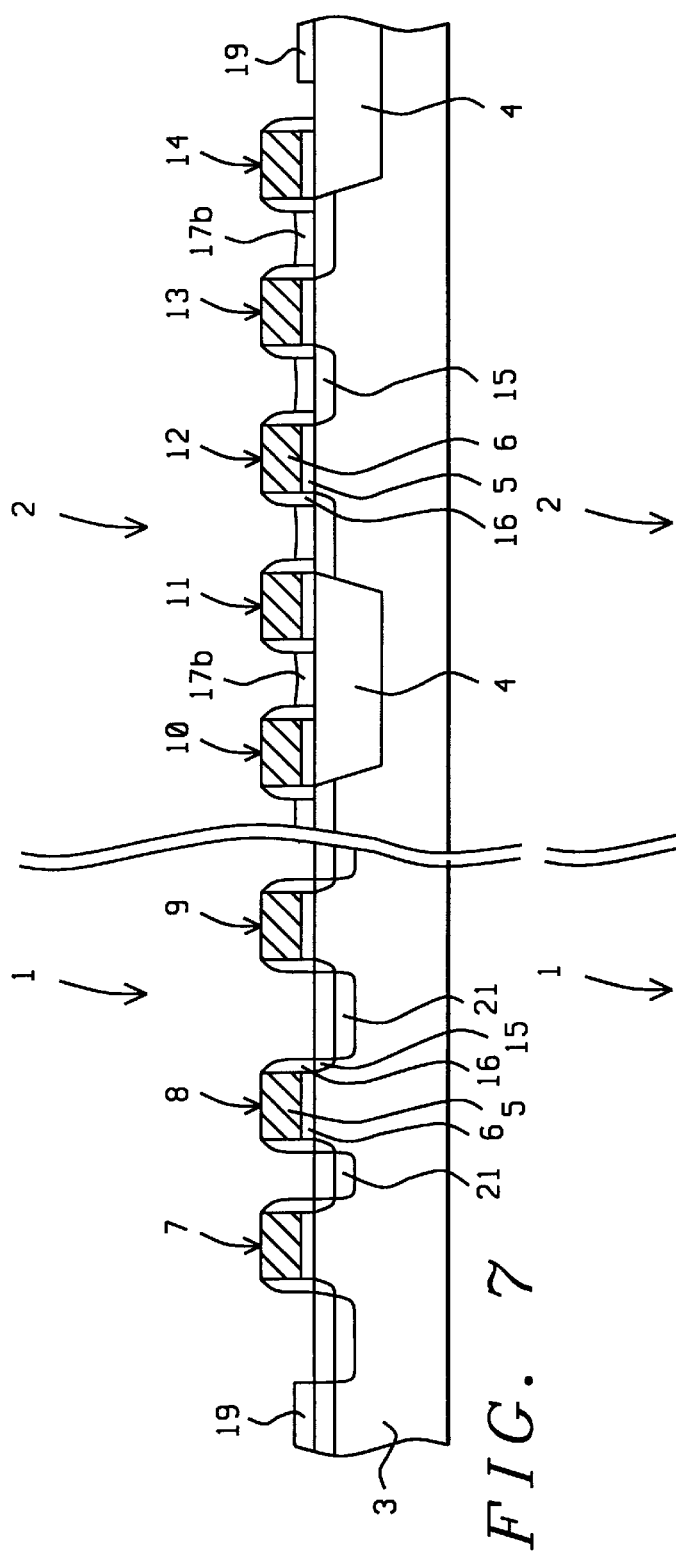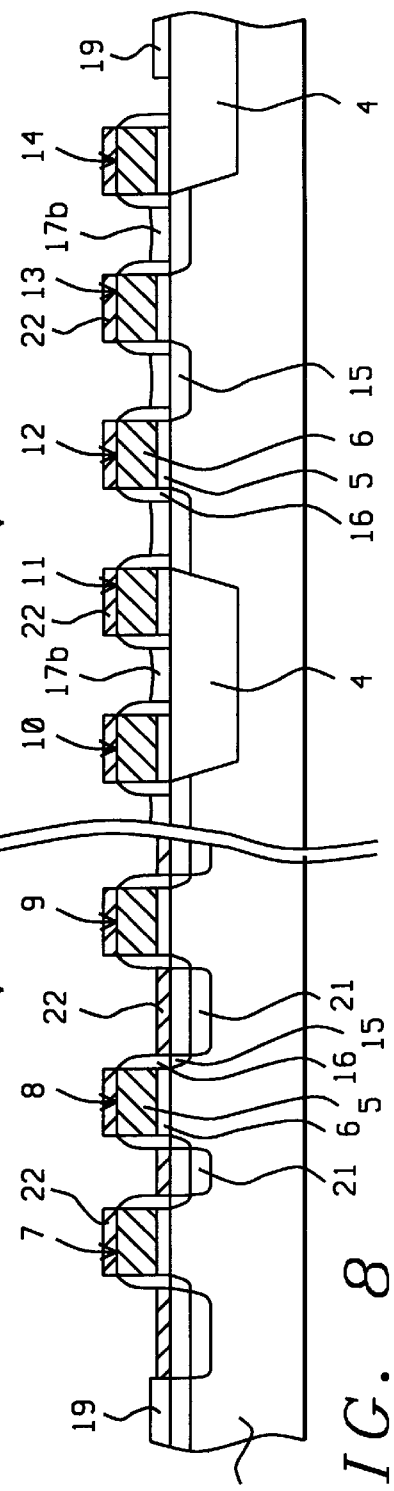

COMMON GATE AND SALICIDE WORD LINE PROCESS FOR LOW COST EMBEDDED DRAM DEVICES

BACKGROUND OF THE INVENTION (1) Field of the Invention

The present invention relates to methods used to fabricate semiconductor devices, and more specifically to a method used to fabricate both logic and embedded dynamic random access memory, (DRAM), devices, on the same semiconductor substrate, featuring a self-aligned metal silicide, (salicide), layer, formed on the gate structures for both the logic and embedded DRAM devices, while only formed on the source/drain regions of the logic devices.

(2) Description of Prior Art

To decrease the resistance of word lines, for logic devices as well as for DRAM devices, a salicide layer is employed on an underlying polysilicon gate structure. The same salicide layer is also used on the source/drain regions of logic devices, again to increase the conductivity of these elements. However for reliability reasons salicide layers are not used on source/drain regions of DRAM devices. Therefore to reduce cost and process complexity, process sequences have been generated in which both logic and embedded DRAM devices are simultaneously formed on the same semiconductor chip, featuring salicided gate structures and salicided source/drain regions for logic devices, but forming salicide only on the gate structures of the embedded DRAM devices.

Prior art, such as Sung, in U.S. Pat. No. 5,858,831, do show salicide formation on the source/drain regions of logic devices and an absence of salicide on the DRAM source/drain regions. However that prior art does not form a salicide layer on the gate structure, but forms polycide, (metal silicide—polysilicon), gate structures for both logic and DRAM devices, prior to forming a salicide layer on the source/drain region of the logic device. This present invention will describe a process sequence for simultaneous fabrication of both logic devices and embedded DRAM devices, in which salicide layers are simultaneously formed on the gate structures of both device types, but on only the source/drain region of the logic devices, thus presenting the desired performance increase for the logic devices, offered by the salicided source/drain regions, while preventing reliability concerns for the DRAM devices by blocking the salicide formation on the DRAM source/drain regions.

SUMMARY OF THE INVENTION

It is an object of this invention to simultaneously fabricate logic devices and embedded DRAM devices, on the same semiconductor substrate.

It is another object of this invention to simultaneously form a self-aligned metal silicide, (salicide), layer on the gate structures, and on the source/drain regions of the logic devices, and on the gate structures of the DRAM devices, leaving the source/drain regions of the DRAM devices, without salicide.

It is still another object of this invention to use a silicon oxide shape, obtained via a high density plasma, (HDP), deposition, in the spaces between DRAM gate structures, or word lines, to prevent salicide formation on underlying lightly doped source/drain regions.

In accordance with the present invention a process is described for simultaneous fabrication of logic, as well as embedded DRAM devices, on the same semiconductor substrate, featuring the formation of a salicide layer on the gate structures, and source/drain regions of the logic devices, while only forming the same salicide layer only on the gate structures of the DRAM devices. Polysilicon gate, or word line structures are formed on an underlying gate insulator layer, in a first region of the semiconductor substrate, to be used for logic devices, and in a second region of the semiconductor substrate, to be used for the embedded DRAM devices. The embedded DRAM device region is designed with narrow spaces between word lines structures, while the logic device region is designed to accommodate wide, as well as narrow spaces between the word line structures. After formation of lightly doped source/drain, (LDD), regions, in the spaces between gate structures, in both logic and DRAM device regions, silicon nitride spacers are formed on the sides of all gate structures. An HDP silicon oxide layer is next deposited resulting in thick silicon oxide shapes, in the narrow spaces between gate structures, and resulting in thin silicon oxide shapes, located in the wide spaces between gate structures, or word lines. Thin silicon oxide shapes are also formed on the top surface of all gate structures. A dry etch procedure is then used to completely remove the thin silicon oxide shapes from the top surface of all gate structures, as well to remove the thin silicon oxide shapes, located in the wide spaces between gate structures. The same dry etch procedure only removes a portion of the thick silicon oxide shapes located in the narrow spaces between gate structures, resulting in silicon oxide blocking shapes. A photoresist shape is next used as an etch mask to protect the silicon oxide blocking shapes, located in the embedded DRAM device region, while remaining silicon oxide blocking shapes are removed from the wide spaces, located between logic device, gate structures. Heavily doped source/drain regions are next formed in the logic device region, in the spaces between word line or gate structures, while the silicon oxide blocking shapes, prevent formation of the heavily doped source/drain regions, in the embedded DRAM device region. A metal layer is then deposited, followed by an anneal procedure, forming self-aligned metal silicide, (salicide), shapes, on regions in which the metal layer overlayed the top surface of all gate structures, and overlayed the top surface of the heavily doped source/drain region, in the logic device region. Regions of unreacted metal, located on the silicon oxide blocking shapes, as well as on the silicon nitride spacers, are then selectively removed.

BRIEF DESCRIPTION OF THE DRAWINGS

The object and other advantages of this invention are best described in the preferred embodiments with reference to the attached drawings that include:

FIGS. 1–8, which schematically, in cross-sectional style, describe key stages of fabrication used to simultaneously create: logic devices with salicide shapes on the top surface of gate structures, as well as on heavily doped source/drain regions; and embedded DRAM devices, with salicide shapes only located on gate structures.

DESCRIPTION OF THE PREFERRED EMBODIMENTS

Figure 5:
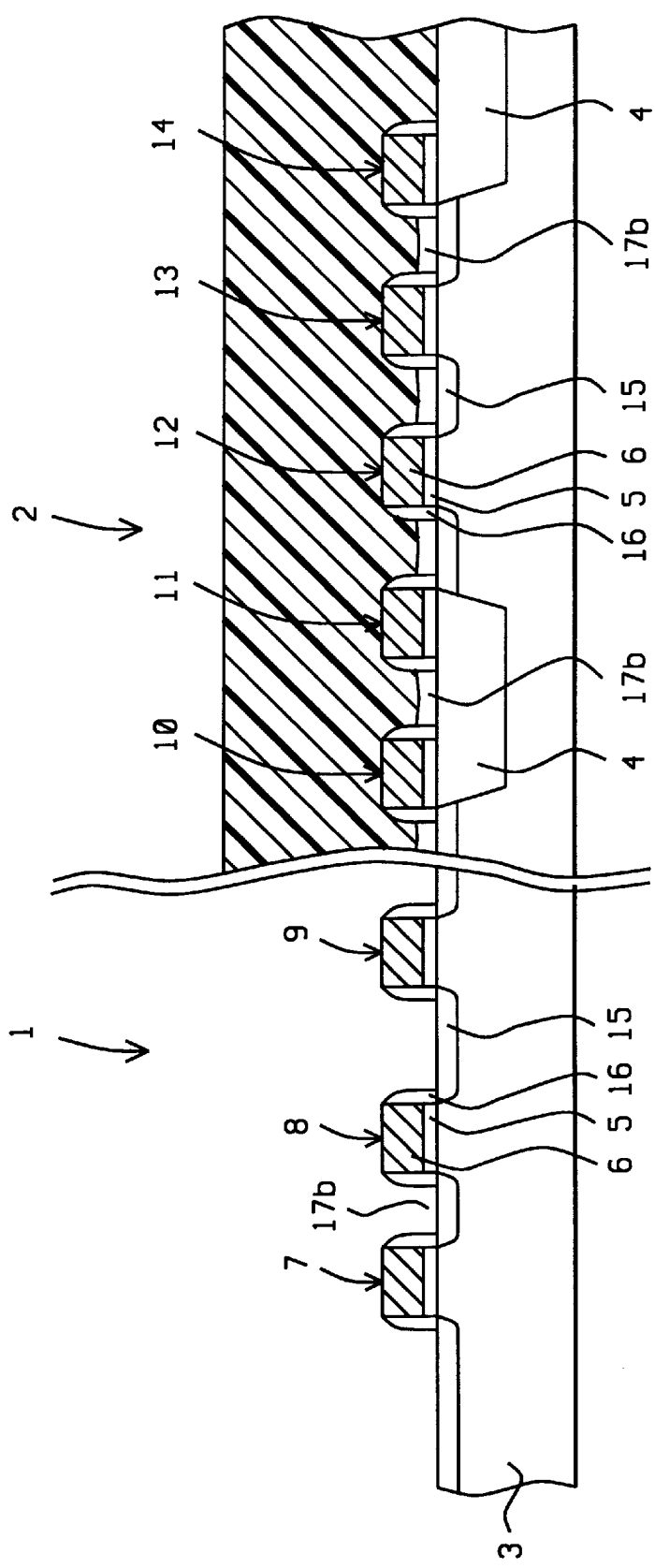

The method of fabricating logic devices, featuring salicide shapes on the gate structures, as well as on the heavily doped source drain regions, and simultaneously fabricating embedded DRAM devices, featuring salicide shapes only on gate structures, will now be described in detail. Although this description will feature N channel, or NMOS devices, for both the logic and embedded DRAM devices, this invention can also be applied to P channel, or PMOS devices, or to complimentary, or CMOS devices. A P type, semiconductor substrate 3, comprised of single crystalline silicon, with a <100> crystallographic orientation is used and schematically shown in FIG. 1. Region 1, of semiconductor substrate 3, will be used for fabrication of the high performance, logic devices, while region 2, will be used for formation of the embedded DRAM devices. Isolation regions 4, such as insulator filled shallow trenches, or thermally grown, field oxide, (FOX), regions, are formed and also schematically shown in FIG. 1. Gate insulator layer 5, comprised of silicon dioxide, is thermally grown in an oxygen—steam ambient, to a thickness between about 32 to 150 Angstroms. Polysilicon layer 6, is next deposited to a thickness between about 2000 to 2500 Angstroms, via low pressure chemical vapor deposition, (LPCVD), procedures. Polysilicon layer 6, is either doped in situ, via the addition of arsine, or phosphine, to a silane ambient, or polysilicon layer 6, is deposited intrinsically then doped via implantation of arsenic or phosphorous ions. Conventional photolithographic and anisotropic, reactive ion etching, (RIE), procedures, using $Cl_2$ or $SF_6$ as an etchant for polysilicon, are then employed to create gate structures, or word line structures 7–14, shown schematically in FIG. 1. The spaces between all word line, or gate structures, in embedded DRAM device region 2, and between word line structure 7, and word line structure 8, in logic device region 1, are narrow in width, between about 2250 to 3600 Angstroms, while the space between word line structure 8, and word line structure 9, in logic device region 1, is larger in width, between about 4000 to 40000 Angstroms. The photoresist shape used for definition of the word lines is then removed via plasma oxygen ashing and careful wet cleans. The RIE procedure used to define the word lines, as well as the subsequent wet cleans, remove regions of gate insulator layer 5, not covered by the word lines.

Lightly doped source/drain, (LDD), regions 15, shown schematically in FIG. 2, are next formed via ion implantation of arsenic or phosphorous ions, in regions of the semiconductor substrate not covered by the polysilicon word lines or by the isolation regions. The ion implantation procedure is performed at an energy between about 60 to 120 KeV, at a dose between about 1E13 to 1E14 atoms/$cm^2$. A silicon nitride layer is then deposited, via LPCVD or via a plasma enhanced chemical vapor deposition, (PECVD), procedure, to a thickness between about 800 to 1000 Angstroms. An anisotropic RIE procedure, using $CF_4/SF_6$ as an etchant, is then used to form silicon nitride spacers 16, on the sides of word line structures 7–14. This is schematically shown in FIG. 2.

A critical high density plasma, (HDP), deposited, silicon oxide layer 17a, is next deposited at a temperature between about 400 to 600° C. The nature of the HDP deposition procedure is the conformality or edge coverage of the deposited HDP silicon oxide layer, increases as width of the space needed to be filled, decreases. Thus the HDP procedure results in thicker silicon oxide layers in narrow spaces, such as the spaces between word line structures 10–14, in embedded DRAM region 2, compared to the thickness of the HDP silicon oxide layer in wider spaces, such as the space between word line structures 8–9, in logic device region 1. Therefore HDP silicon oxide layer 17a, is deposited to a thickness between about 2500 to 3000 Angstroms, in the narrow spaces, between gate structures, but only deposited to a thickness between about 1000 to 1500 Angstroms, in the wider space between gate structures. The thickness of HDP layer 17a, deposited on the top surface of all gate structures is between about 500 to 1000 Angstroms. The result of the HDP silicon oxide deposition is schematically shown in FIG. 3. The difference in thickness of silicon oxide layer 17a, as a function of location, will be critical in attainment of the desired result of forming a silicon oxide blocking shape to subsequently prevent creation of a heavily doped source/drain region, and of a salicide shape, in the embedded DRAM device region.

A dry etching procedure, such as RIE, is next employed to remove the thinner regions of HDP silicon oxide layer 17a, located on the top surface of all word line structures, as well as the regions of HDP silicon oxide layer 17a, located in the wide space between word line structures 8 and 9. This dry etching procedure, performed using $CF_4/O_2$ as an etchant, also partially etches the thicker regions of the HDP silicon oxide layer, located in the narrow spaces between word line structures, resulting in silicon oxide blocking shapes 17b, located on LDD regions 15, between word line structures 10–14, in embedded DRAM device region 2, and located on LDD region 15, between word line structures 7 and 8, in logic device region 1. The thickness of silicon oxide blocking shapes 17b, shown schematically in FIG. 4, is between about 1000 to 1500 Angstroms. Removal of unwanted silicon oxide blocking shape 17b, located between word line structures 7 and 8, in logic device region 1, is next accomplished via a wet etch procedure, using a buffered hydrofluoric acid solution. Photoresist shape 18, is used as a mask, protecting silicon oxide blocking shapes 17b, in embedded DRAM device region 2, during the wet etch procedure. The result of this procedure is shown schematically in FIG. 5.

Figure 6:
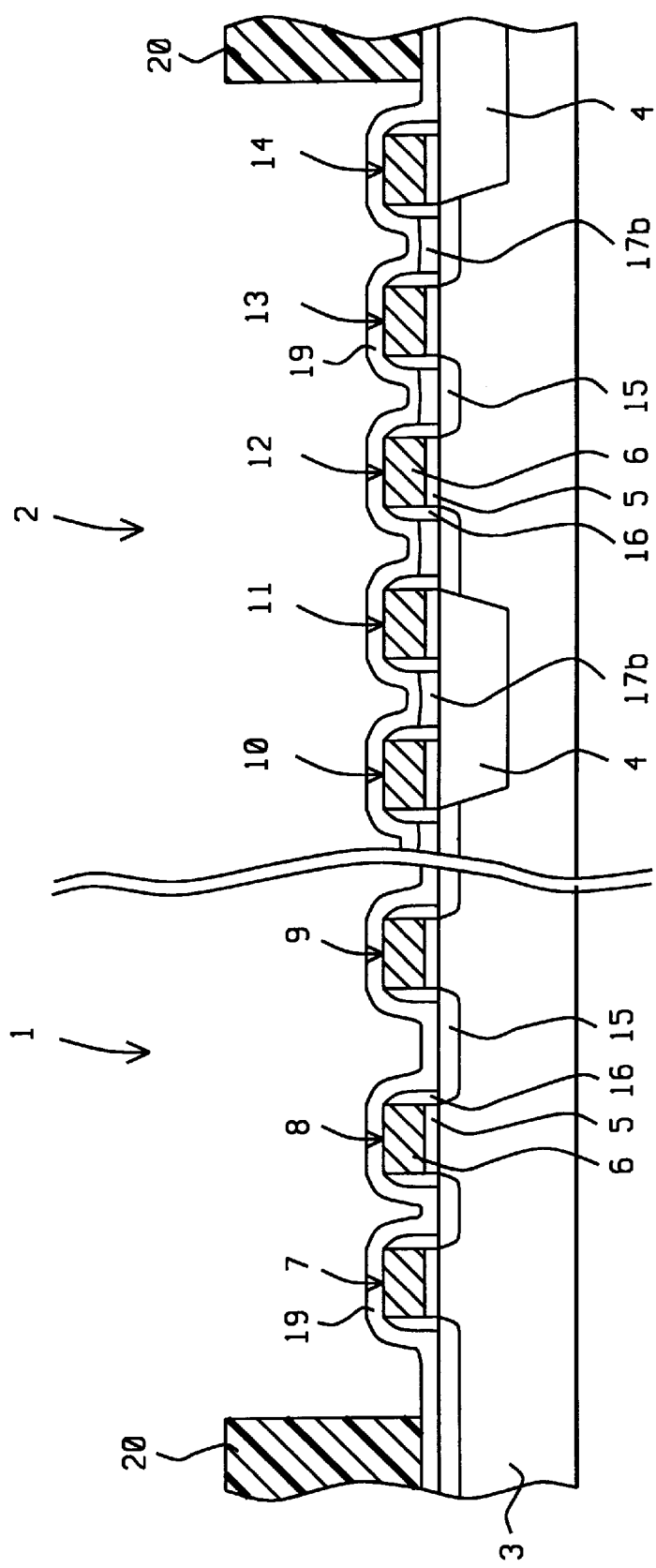

After removal of photoresist shape 18, via plasma oxygen ashing and careful wet cleans, a rapid process oxide, (RPO), layer 19, shown schematically in FIG. 6, is deposited via PECVD procedures, at a thickness between about 200 to 350 Angstroms. The RPO, silicon oxide layer will be used to protect regions of semiconductor substrate 3, not protected by silicon oxide blocking shapes 17b, (embedded DRAM device region 2, is still protected by silicon oxide blocking shapes 17b), from subsequent heavily doped source/drain, and from subsequent salicide formation. Photoresist shape 20, is used as a mask to allow the region of RPO oxide layer 19, located in logic device region 1, and in embedded DRAM device region 2, to be removed via a selective wet etch, using buffered hydrofluoric acid. The etch rate of the RPO oxide layer, in buffered hydrofluoric acid, is greater than the etch rate of silicon oxide blocking shapes 17b, therefore after removal of RPO oxide layer 19, in logic device region 1, and in embedded DRAM device region 2, the thickness of silicon oxide blocking shapes 17b, in embedded DRAM device region 2, is still between about 1200 to 1500 Angstroms.

Photoresist shape 20, used to define RPO oxide shapes 19, is next removed via plasma oxygen ashing and careful wet cleans. This is schematically shown in FIG. 7. Heavily doped source/drain regions 21, are next formed in areas of logic device region 1, not covered by word line structures 7–9, or by silicon nitride spacers 16, located on the word line structures. Heavily doped source/drain regions 21, schematically shown in FIG. 7, are formed via ion implantation of arsenic or phosphorous ions, at an energy between about 30 to 60 KeV, at a dose between about 1E14 to 1E15 atoms/$cm^2$. Silicon oxide blocking shapes 17b, prevented the formation of heavily doped source/drain region 21, in embedded DRAM region 2, while RPO oxide shape 19, protected other regions on semiconductor substrate 3, from formation of the heavily doped source/drain region.

The formation of salicide shapes 22, on the top surface of all word line structures, as well as on heavily doped source/drain regions 21, in logic device region 1, is next addressed and schematically shown in FIG. 8. A metal layer, such as titanium or cobalt, is deposited via plasma vapor deposition, (PVD), procedures, to a thickness between about 200 to 400 Angstroms. An anneal procedure, performed either in a rapid thermal anneal, (RTA), furnace, or in a conventional furnace, is employed at a temperature between about 750 to 880° C., in a nitrogen ambient, resulting in the formation of a salicide layer, such as titanium silicide, or cobalt silicide, on regions in which the metal layer overlaid either a word line polysilicon surface, or a heavily doped source/drain region. Regions in which the metal layer resided on silicon oxide blocking shapes 17b, or silicon nitride spacers 16, remained unreacted. Removal of unreacted metal is accomplished via use of a solution of $H_2O_2$—$NH_4OH$, resulting in the desired salicide shapes on all word line structures, and on the heavily doped source/drain region, in logic device region 1. If desired a second anneal procedure can be performed, again in either an RTA or a conventional furnace, to reduce the resistance of the salicide shapes, resulting in reductions in word line resistance.

While this invention has been particularly shown and described with reference to, the preferred embodiments thereof, it will be understood by those skilled in the art that various changes in form and details may be made without departing from the spirit and scope of this invention.

What is claimed is:

1. A method of simultaneously fabricating logic devices and embedded DRAM devices, on a semiconductor substrate, comprising the steps of:

providing a first region of said semiconductor substrate for fabrication of said logic devices, and providing a second region of said semiconductor substrate for fabrication of said embedded DRAM devices;

forming a first set of gate structures on an underlying gate insulator layer, in said first region of said semiconductor substrate, with gate structures of said first set of gate structures separated by first spaces, and simultaneously forming a second set of gate structures on said underlying gate insulator layer, in said second region of said semiconductor substrate, with gate structures of said second set of gate structures separated by second spaces, and wherein said second spaces are narrower in width than said first spaces;

forming lightly doped source/drain, (LDD), regions in areas of said semiconductor substrate not covered by said first set of gate structures, or by said second set of gate structures;

forming insulator spacers on the sides of gate structures;

forming silicon oxide blocking shapes on underlying LDD regions, with said silicon oxide blocking shapes located in said second spaces, in said second region of said semiconductor substrate;

forming heavily doped source/drain region in an area of said first region of said semiconductor substrate, not covered by gate structures of said first set of gate structures, and not covered by said insulator spaces; and forming a self aligned metal silicide, (salicide), layer: on the top surface of gate structures of said first set of gate structures; on the top surface of gate structures in said second set of gate structures; and on said heavily doped regions, in said first region of said semiconductor substrate.

2. The method of claim 1, wherein said gate insulator layer is a silicon dioxide layer, obtained via thermal oxidation procedures at a thickness between about 32 to 150 Angstroms.

3. The method of claim 1, wherein said gate structures, of said first set, and of said second set of gate structures, are comprised of a polysilicon layer, obtained via LPCVD procedures, at a thickness between about 2000 to 2500 Angstroms, and either doped in situ during deposition, via the addition of arsine or phosphine, to a silane ambient, or deposited intrinsically, then doped via implantation of arsenic or phosphorous ions.

4. The method of claim 1, wherein said gate structures, of said first set, and of said second set of gate structures, are defined via an anisotropic RIE procedure, using $Cl_2$ or $SF_6$ as an etchant for polysilicon.

5. The method of claim 1, wherein said first spaces, located between gate structures of said first set of gate structures, are between about 4000 to 40000 Angstroms, in width.

6. The method of claim 1, wherein said second spaces, located between gate structures of said second set of gate structures, are between about 2250 to 3600 Angstroms, in width.

7. The method of claim 1, wherein said insulator spacers are comprised of silicon nitride, obtained via deposition of a silicon nitride layer, at a thickness between about 800 to 1000 Angstroms, and defined via an anisotropic RIE procedure using $CF_4/SF_6$ as an etchant for silicon nitride.

8. The method of claim 1, wherein said silicon oxide blocking shapes, in said second spaces, are comprised of silicon oxide, obtained via a high density plasma deposition, to a thickness between about 2500 to 3000 Angstroms, then subjected to a dry etching procedure, using $CF_4/O_2$ as an etchant, resulting in a thickness between about 1000 to 1500 Angstroms, for said silicon oxide blocking shapes.

9. The method of claim 1, wherein said salicide layer is a titanium silicide, or a cobalt silicide layer, obtained via: deposition of titanium or cobalt, via plasma vapor deposition procedures, to a thickness between about 200 to 400 Angstroms; annealing in a rapid thermal anneal furnace at a temperature between about 750 to 880° C., to create said salicide layer on silicon or polysilicon features; and removing unreacted cobalt or titanium, from the top surface of said silicon oxide blocking shapes, and from said insulator spacers.

10. A method of blocking salicide formation on source/drain regions of embedded DRAM devices, simultaneously fabricated with logic devices formed with salicide layers on source/drain regions, comprising the steps of:

providing a first region of a semiconductor substrate, used for a logic device region, and providing a second region of said semiconductor substrate, used for an embedded DRAM device region;

forming a silicon dioxide gate insulator layer;

forming a first set of polysilicon gate structures in said logic device region, with first spaces separating individual polysilicon gate structures, in said first set of polysilicon gate structures, and simultaneously forming a second set of polysilicon gate structures in said embedded DRAM device region, with second spaces, larger in width than said first spaces, separating individual polysilicon gate structures, in said second set of polysilicon gate structures;

forming lightly doped source/drain, (LDD), regions in an area of said semiconductor substrate not covered by said first set of polysilicon gate structures, or by said second set of polysilicon gate structures;

forming silicon nitride spacers on the sides of said first set of polysilicon gate structures, and on the sides of said second set of polysilicon gate structures; depositing a high density plasma, (HDP), silicon oxide layer: forming a thin HDP silicon oxide layer on the top surface of all polysilicon gate structures; forming said thin HDP silicon oxide layer in said first spaces, located between individual polysilicon gate structures in said first set of polysilicon gate structures; and forming on a thick HDP silicon oxide layer in said second spaces, located between individual polysilicon gate structures in said second set of polysilicon gate structures;

performing a dry etch procedure to remove said thin HDP silicon oxide layer from the top surface of all polysilicon gate structures, and to remove said thin HDP silicon oxide layer from said first spaces, in said logic device region, while removing top portion of said thick HDP silicon oxide layer, in said second spaces, in said embedded DRAM device region, forming silicon oxide blocking shapes, located between individual polysilicon gate structures, in said second set of polysilicon gate structures;

forming heavily doped source/drain regions in said logic device region, in an area of said semiconductor substrate not covered by said first set of polysilicon gate structures, or by said silicon nitride spacers, located on the sides of said first set of polysilicon gate structures; and forming said salicide layer on the top surface of said second set of polysilicon gate structures, in said embedded DRAM device region, and on the top surface of said first set of polysilicon gate structures, and on said heavily doped source/drain regions, located in said logic device region.

11. The method of claim 10, said silicon dioxide gate insulator layer is obtained via thermal oxidation procedures at a thickness between about 32 to 150 Angstroms.

12. The method of claim 10, wherein said first set of polysilicon gate structures, and said second set of gate structures, are comprised of polysilicon, obtained from deposition of a polysilicon layer via LPCVD procedures, at a thickness between about 2000 to 2500 Angstroms, and either doped in situ during deposition, via the addition of arsine or phosphine, to a silane ambient, or deposited intrinsically, then doped via implantation of arsenic or phosphorous.

13. The method of claim 10, wherein said first set of polysilicon gate structures, and said second set of polysilicon gate structures, are defined via an anisotropic RIE procedure, using $Cl_2$ or $SF_6$ as an etchant for polysilicon.

14. The method of claim 10, wherein said first spaces, located between individual polysilicon gate structures, in said first set of said polysilicon gate structures, are between about 2250 to 3600 Angstroms in width.

15. The method of claim 1, wherein said second spaces, located between individual polysilicon gate structures in said second set of polysilicon gate structures, are between about 4000 to 40000 Angstroms in width.

16. The method of claim 10, wherein said LDD regions are formed via ion implantation of arsenic, or phosphorous ions, at an energy between about 60 to 120 KeV, at a dose between about 1E13 to 1E14 atoms/cm$^2$.

17. The method of claim 10, wherein said silicon nitride spacers are formed from a silicon nitride layer, obtained via LPCVD or PECVD procedures to a thickness between about 800 to 1000 Angstroms, then defined via an anisotropic RIE procedure using $CF_4/SF_6$ as an etchant for silicon nitride.

18. The method of claim 10, wherein said thin HDP silicon oxide layer, located on all polysilicon gate structures, and in said second spaces between individual polysilicon gate structures in said embedded DRAM device region, is between about 1000 to 1500 Angstroms in thickness.

19. The method of claim 10, wherein said thick HDP silicon oxide layer, located in said first spaces between individual polysilicon gate structures in said logic device region, is between about 2500 to 3000 Angstroms in thickness.

20. The method of claim 10, wherein said dry etch procedure, used to form said silicon oxide blocking shapes, is performed is a RIE procedure, using $CF_4/O_2$ as an etchant for HDP silicon oxide.

21. The method of claim 10, wherein the thickness of said silicon oxide blocking shapes is between about 1000 to 1500 Angstroms.

22. The method of claim 10, wherein said heavily doped source/drain regions, located in said logic device region, are formed via ion implantation of arsenic, or phosphorous ions, at an energy between about 30 to 60 KeV, at a dose between about 1E14 to 1E15 atoms/cm$^2$.

23. The method of claim 10, wherein said salicide layer is a titanium silicide, or a cobalt silicide layer, obtained via: deposition of titanium or cobalt, via plasma vapor deposition procedures, to a thickness between about 200 to 400 Angstroms; annealing in a rapid thermal anneal furnace at a temperature between about 750 to 880° C., to create said salicide layer on said heavily doped source/drain regions, and on the top surface of all polysilicon gate structures; and removing unreacted cobalt or titanium, from the top surface of said silicon oxide blocking shapes, and from said silicon nitride spacers.

* * * * *